United States Patent
Farooq et al.

(10) Patent No.: US 11,355,379 B1
(45) Date of Patent: Jun. 7, 2022

(54) OXIDE-BONDED WAFER PAIR SEPARATION USING LASER DEBONDING

(71) Applicant: INTERNATIONAL BUSINESS MACHINES CORPORATION, Armonk, NY (US)

(72) Inventors: Mukta Ghate Farooq, Hopewell Junction, NY (US); Dale Curtis McHerron, Staatsburg, NY (US); Spyridon Skordas, Troy, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 17/103,793

(22) Filed: Nov. 24, 2020

(51) Int. Cl.
*H01L 21/683* (2006.01)
*H01L 23/48* (2006.01)
*H01L 21/768* (2006.01)

(52) U.S. Cl.
CPC .... *H01L 21/6835* (2013.01); *H01L 21/76898* (2013.01); *H01L 23/481* (2013.01); *H01L 2221/68372* (2013.01); *H01L 2221/68381* (2013.01)

(58) Field of Classification Search
CPC .......... H01L 21/6835; H01L 21/76898; H01L 23/481; H01L 2221/68372; H01L 2221/68381
USPC ....................................................... 257/621
See application file for complete search history.

(56) References Cited

U.S. PATENT DOCUMENTS

| 9,076,701 | B2 * | 7/2015 | Han | H01L 23/49827 |
| 9,130,056 | B1 * | 9/2015 | Holden | H01L 21/563 |
| 9,269,561 | B2 * | 2/2016 | Dang | H01L 21/67092 |
| 9,401,303 | B2 | 7/2016 | Cheng et al. | |

(Continued)

FOREIGN PATENT DOCUMENTS

| CN | 104045052 A | 9/2014 |
| CN | 107275197 A | 10/2017 |
| TW | 201110248 A1 | 3/2011 |

OTHER PUBLICATIONS

Ober, C. K., et al., "Scissionable Polymer Photoresist for Extreme Ultraviolet Lithography"; Research Accomplishments (2018-2019); pp. 106-107.

(Continued)

*Primary Examiner* — Vu A Vu
(74) *Attorney, Agent, or Firm* — Intelletek Law Group, PLLC; Gabriel Daniel, Esq.

(57) ABSTRACT

A method of fabricating a semiconductor structure includes forming a scissionable layer that is able to absorb infrared (IR) radiation, below a first carrier wafer. A first hard-dielectric layer is formed below the scissionable layer. A second hard-dielectric layer is formed on a top surface of a semiconductor wafer. The first dielectric layer is bonded with the second dielectric layer. Connectors on a bottom portion of the semiconductor wafer are formed to provide an electric connection to the semiconductor wafer. A second carrier wafer is connected to the connectors on the bottom portion of the semiconductor wafer. The first carrier wafer is separated from the semiconductor wafer by degrading the scissionable layer with an IR, by passing the IR through the first carrier wafer. A back end of line (BEOL) wiring passing from a top surface of the semiconductor wafer through the first and second dielectric layers is provided.

18 Claims, 10 Drawing Sheets

(56) References Cited

U.S. PATENT DOCUMENTS

| | | | |
|---|---|---|---|
| 9,627,365 B1* | 4/2017 | Yu | H01L 23/5389 |
| 10,504,824 B1* | 12/2019 | Pan | H01L 21/561 |
| 2016/0133486 A1 | 5/2016 | Andry et al. | |
| 2016/0133497 A1 | 5/2016 | Andry et al. | |
| 2017/0294392 A1 | 10/2017 | Li | |
| 2019/0295877 A1 | 9/2019 | Zhang et al. | |
| 2020/0168475 A1 | 5/2020 | Andry et al. | |

OTHER PUBLICATIONS

Uhrmann, T. et al., "Laser Debonding Enables Advanced Thin Aafer Processing"; Research Gate (2013); 6 pgs.
International Search Report and Written Opinion dated Jan. 26, 2022 is related application No. PCT/CN2021/124902; 9 pgs.

* cited by examiner

OXIDE-BONDED WAFER PAIR SEPARATION USING LASER DEBONDING

BACKGROUND

Technical Field

The present disclosure generally relates to semiconductor devices, and more particularly, to the temporary joining of a semiconductor wafer to a carrier wafer during processing and methods of manufacturing the same.

Description of the Related Art

Today, integrated circuits are typically produced on semiconductor wafers that undergo various processing steps. Wafers are often thinned for further processing. At certain thicknesses the wafers become structurally fragile for further processing. To that end the thinned wafers are temporarily bonded to handling wafers, preferably before thinning, to make further processing possible. The semiconductor wafer may be attached to the handler wafer using an adhesive that is applied to the semiconductor wafer, the handler wafer, or both. After the semiconductor wafer is processed, it may be separated from the handler wafer by dissolving the bonded adhesive using, for example, solvents or lasers.

SUMMARY

According to one embodiment, semiconductor structure, a carrier wafer. A semiconductor wafer is coupled on top of the carrier wafer. A first dielectric layer is on top of the semiconductor wafer. A second dielectric layer is directly bonded on top of the first dielectric layer. One or more back end of line (BEOL) wiring passes from a top surface of the semiconductor wafer through the first and second dielectric layers.

In one embodiment, the first and second dielectric layers comprise oxide.

In one embodiment, the first and second dielectric layers have a thermal conductivity equal to or higher than that of Silicon oxide.

In one embodiment, the first and second dielectric layers comprise a diamond film.

In one embodiment, a width of the semiconductor wafer is thinned to 50 µm to 100 µm.

In one embodiment, the carrier wafer comprises glass.

In one embodiment, the bond between the first dielectric layer and the second dielectric layer is an oxynitride bond.

In one embodiment, the bond between the first dielectric layer and the second dielectric layer is a nitride bond.

According to one embodiment, a method of fabricating a semiconductor structure includes providing a first carrier wafer and forming a scissionable layer that is able to absorb infrared (IR) radiation, below the first carrier wafer. A first hard-dielectric layer is formed below the scissionable layer. A second hard-dielectric layer is formed on a top surface of a semiconductor wafer. The first dielectric layer is directly bonded with the second dielectric layer. Connectors are formed on a bottom portion of the semiconductor wafer to provide an electric connection to the semiconductor wafer. A second carrier wafer is connected to the connectors on the bottom portion of the semiconductor wafer. The first carrier wafer is separated from the semiconductor wafer by degrading the scissionable layer with an infrared (IR) radiation, by passing the IR through the first carrier wafer. A back end of line (BEOL) wiring passing from a top surface of the semiconductor wafer through the first and second dielectric layers is provided.

In one embodiment, the scissionable layer comprises aluminum (Al).

In one embodiment, the scissionable layer is a Light-To-Heat-Conversion Release Coating (LTHC) layer.

In one embodiment, the first and second dielectric layers comprise oxide.

In one embodiment, after the direct bonding of the first dielectric layer with the second dielectric layer, a thermal anneal is performed to create a stronger bond between the first dielectric layer and the second dielectric layer.

In one embodiment, after the direct bonding of the first dielectric layer with the second dielectric layer, the semiconductor wafer In one embodiment, semiconductor wafer is thinned to 50 um to 100 um.

In one embodiment, at least one of a top surface or a bottom surface of the carrier wafer are thinned with an anti-reflective layer.

In one embodiment, the anti-reflective layer comprises nitride.

In one embodiment, the second carrier wafer is connected below the semiconductor wafer with an adhesive.

In one embodiment, upon separating the first carrier wafer from the semiconductor wafer, a residual of the scissionable layer is removed by way of a chemical etching of the scissionable layer.

In one embodiment, the semiconductor wafer includes a scissionable layer below the second hard-dielectric layer.

The techniques described herein may be implemented in a number of ways. Example implementations are provided below with reference to the following figures.

BRIEF DESCRIPTION OF THE DRAWINGS

The drawings are of illustrative embodiments. They do not illustrate all embodiments. Other embodiments may be used in addition or instead. Details that may be apparent or unnecessary may be omitted to save space or for more effective illustration. Some embodiments may be practiced with additional components or steps and/or without all the components or steps that are illustrated. When the same numeral appears in different drawings, it refers to the same or like components or steps.

DETAILED DESCRIPTION

Overview

In the following detailed description, numerous specific details are set forth by way of examples to provide a thorough understanding of the relevant teachings. However, it should be apparent that the present teachings may be practiced without such details. In other instances, well-known methods, procedures, components, and/or circuitry have been described at a relatively high-level, without detail, to avoid unnecessarily obscuring aspects of the present teachings.

In one aspect, spatially related terminology such as "front," "back," "top," "bottom," "beneath," "below," "lower," above," "upper," "side," "left," "right," and the like, is used with reference to the orientation of the Figures being described. Since components of embodiments of the disclosure can be positioned in a number of different orientations, the directional terminology is used for purposes of illustration and is in no way limiting. Thus, it will be understood that the spatially relative terminology is intended to encompass different orientations of the device in use or operation in addition to the orientation depicted in the figures. For example, if the device in the figures is turned over, elements described as "below" or "beneath" other elements or features would then be oriented "above" the other elements or features. Thus, for example, the term "below" can encompass both an orientation that is above, as well as, below. The device may be otherwise oriented (rotated 90 degrees or viewed or referenced at other orientations) and the spatially relative descriptors used herein should be interpreted accordingly.

As used herein, the terms "lateral" and "horizontal" describe an orientation parallel to a first surface of a semiconductor substrate or semiconductor body. For example, substrate can be the surface of a wafer or a die.

As used herein, the term "vertical" describes an orientation that is arranged perpendicular to the first surface of the semiconductor substrate or semiconductor body.

As used herein, the terms "coupled" and/or "electrically coupled" are not meant to mean that the elements must be directly coupled together—intervening elements may be provided between the "coupled" or "electrically coupled" elements. In contrast, if an element is referred to as being "directly connected" or "directly coupled" to another element, there are no intervening elements present. The term "electrically connected" refers to a low-ohmic electric connection between the elements electrically connected together.

Although the terms first, second, etc., may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

Example embodiments are described herein with reference to cross-sectional illustrations that are schematic illustrations of idealized or simplified embodiments (and intermediate structures). As such, variations from the shapes of the illustrations as a result, for example, of manufacturing techniques and/or tolerances, may be expected. Thus, the regions illustrated in the figures are schematic in nature and their shapes do not necessarily illustrate the actual shape of a region of a device and do not limit the scope.

It is to be understood that other embodiments may be used and structural or logical changes may be made without departing from the spirit and scope defined by the claims. The description of the embodiments is not limiting. In particular, elements of the embodiments described hereinafter may be combined with elements of different embodiments.

In the interest of not obscuring the presentation of embodiments of the present disclosure, some processing steps or operations may have been combined together for presentation and for illustration purposes and in some instances may have not been described in detail. In other instances, some processing steps or operations may not be described at all. It should be understood that the following description is rather focused on the distinctive features or elements of various embodiments of the present disclosure.

The present invention relates generally to semiconductor structures and methods of manufacture and, more particularly, to the temporary bonding of a semiconductor wafer, also referred as a device wafer, to a carrier wafer ("carrier"), sometimes referred to herein as a handler, during processing. Today, wafers having a thin profile provide, among other benefits, the use of through-silicon-vias (TSV), thereby facilitating greater device miniaturization and integration. However, by virtue of being thin, the structural integrity is fragile. It is therefore not simple to handle such wafers using existing process techniques and equipment. To that end, temporary bonding of wafers to a thicker carrier provide an effective way for backside processing of thin wafers. Conventional wafer processing involving a carrier may comprise an optically transparent material, such as glass, quartz, or sapphire. An adhesive medium may be used to temporarily bond the device wafer to the handler. After the semiconductor wafer is processed (e.g., backside thinning, solder connection formation, and/or chip dicing), the semiconductor wafer may be de-bonded from the handler.

During a typical de-bonding process, optical or ultraviolet lasers may be directed to the adhesive medium through the optically transparent handler to ablate the adhesive medium and to enable the release of the processed semiconductor wafer from the handler. However, the resulting heat from the laser ablation process may also cause damage to the semiconductor wafer. Additionally, the use of adhesives to temporarily bond the wafers can result in residue on the handlers upon completion of the de-bonding process resulting in contamination and ultimately process yield issues.

Accordingly, the teachings herein provide methods and structures of temporarily joining a semiconductor wafer to a carrier wafer during processing that are not constrained by the thermal and structural limitations of using an adhesive between the semiconductor wafer and the carrier wafer. The techniques described herein may be implemented in a number of ways. Example implementations are provided below with reference to the following figures.

Example Hard-Dielectric Bonded Wafer Pair Structure

Figure 1:
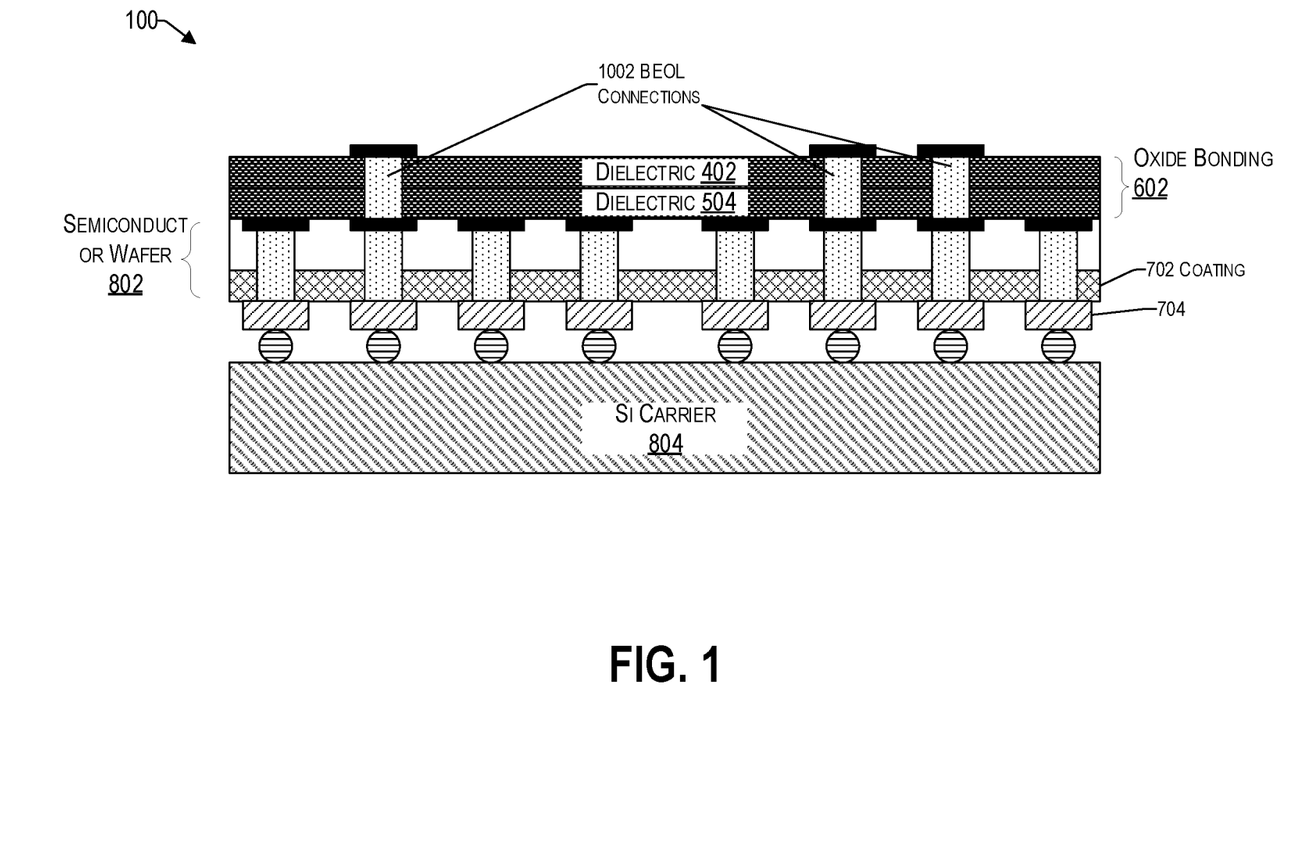
FIG. 1 is a simplified cross-section view of handler and a semiconductor wafer, consistent with an illustrative embodiment.

Reference now is made to FIG. 1, which is a simplified cross-section view 100 of handler and a semiconductor wafer, consistent with an illustrative embodiment. There is a carrier wafer 804 connected to a semiconductor wafer 802, where the carrier wafer 804 is below the semiconductor wafer 802. There is a first hard-dielectric layer 504 on top of the semiconductor wafer. There is a second hard-dielectric layer 402 directly bonded on top of the first dielectric layer 504, together providing a permanently bonded structure 602. In some embodiments, the first and second dielectric layers comprise oxide. The second dielectric layer 402 is part of a previous carrier wafer (not shown) that was used for previous processing steps. The first and second dielectric layers 504 and 402 are not removed; rather, they are used for back end of line (BEOL) wiring 1002 passing from a top surface of the semiconductor wafer 802 through the first and second dielectric layers, thereby providing electrical connectivity to the semiconductor wafer 802.

The semiconductor wafer 802 may be a typical wafer known in the art, and may include multiple layers and materials. The multiple layers may comprise semiconductor materials, dielectric materials, and conductive materials. The semiconductor materials may include any known semiconductor materials, such as, for example, undoped Si, n-doped Si, p-doped Si, single crystal Si, polycrystalline Si, amorphous Si, Ge, SiGe, SiC, SiGeC, Ga, GaAs, InAs, InP and all other III/V or II/VI compound semiconductors. Non-limiting examples of compound semiconductor materials include gallium arsenide, indium arsenide, and indium phosphide. Typically, the semiconductor wafer may be, for example, several hundred microns thick and may have been thinned from 780 um to approximately 100 um or lower.

Example Process

With the foregoing description of the structure of a semiconductor wafer coupled to a carrier wafer of FIG. 1, it may be helpful to discuss an example process of manufacturing the same. To that end, FIGS. 2 to 10 illustrate various steps in the manufacture of semiconductor structure by way of using a carrier, consistent with exemplary embodiments.

Figure 2:
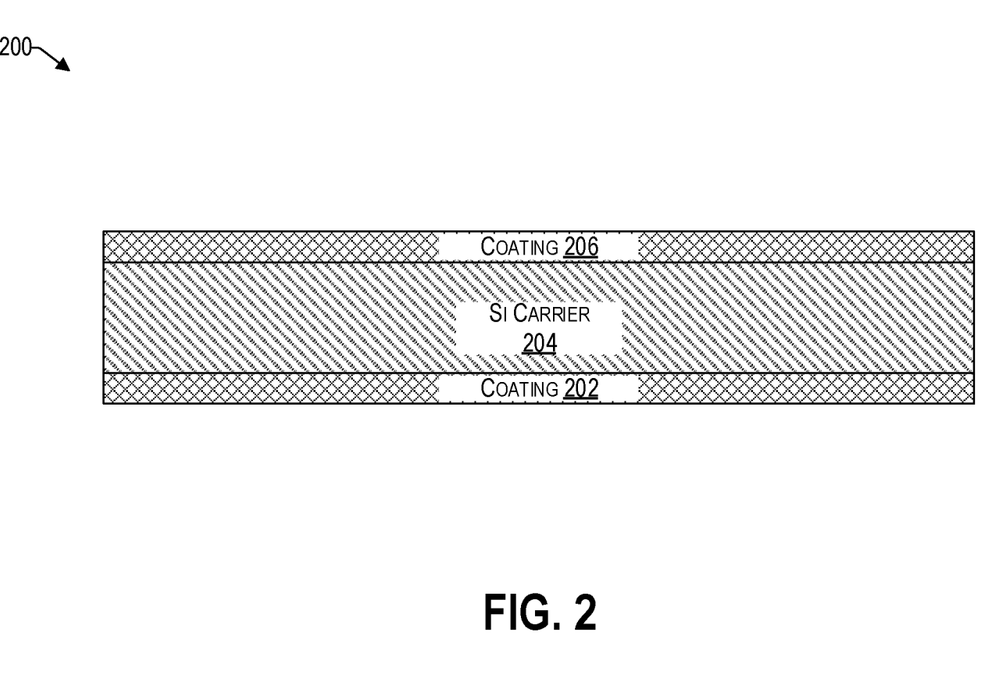
FIG. 2 is a cross section view of a carrier, consistent with an illustrative embodiment.

Referring now to FIG. 2, a cross section view 200 of a carrier (sometimes referred to herein as a carrier wafer) is provided. In one embodiment, the carrier wafer 204 may be composed of a material, such as undoped or lightly doped silicon, that is transparent to infrared (IR) radiation. The carrier 204 may have a height ranging from approximately 400 μm to approximately 1000 μm and an overall diameter that corresponds to the diameter of a corresponding semiconductor wafer that is later coupled thereto. It should be noted that the thickness of the handler can vary depending on its diameter and the requirements for structural stability. In various embodiments, the bottom portion and/or the top portion of the carrier 204 may include an anti-reflective coating layer (e.g., nitride) 202, 206. The thickness of the anti-reflective coating may be optimized for IR absorption by the scissionable layer that is later formed below it, discussed in more detail below.

Figure 3:
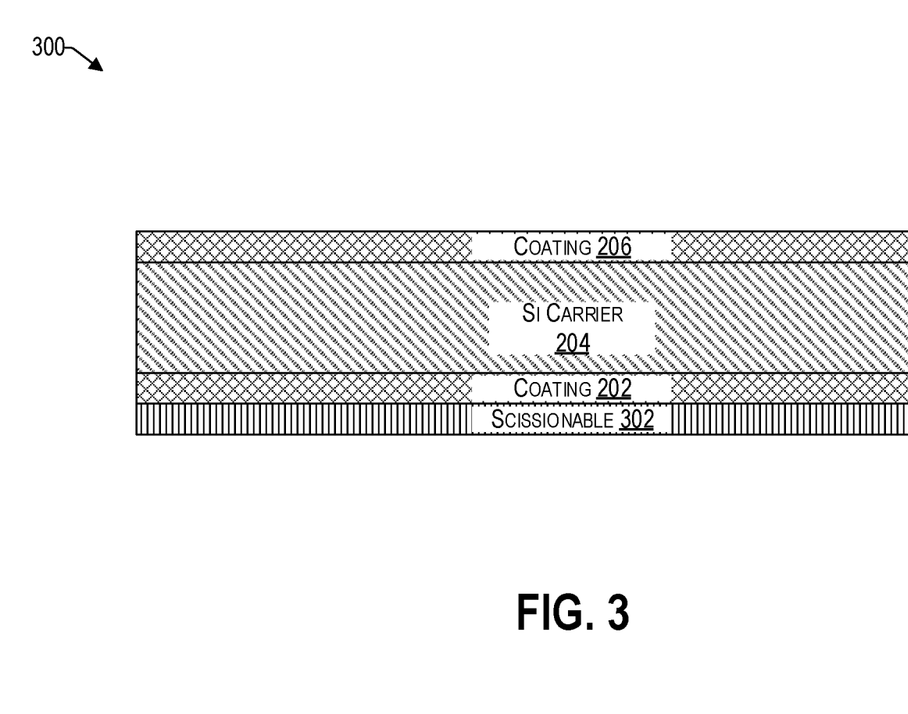
FIG. 3 illustrates a semiconductor structure that includes a scissionable layer, consistent with an illustrative embodiment.

FIG. 3 illustrates a semiconductor structure 300 that includes the scissionable layer 302, sometimes referred to herein as the sacrificial layer. In various embodiments the scissionable layer 302 may be aluminum (Al) or any other Light-To-Heat-Conversion Release Coating (LTHC) layer that is able to absorb IR radiation efficiently (e.g., materials with a higher IR absorption performance are preferred, but materials with lower IR absorption performance need not be excluded). The scissionable layer 302 may be deposited on the bottom surface of the carrier 204 (e.g., below the IR coating 202), using a conventional deposition technique, such as, without limitation, chemical vapor deposition (CVD), plasma enhanced CVD (PECVD), thermal CVD (THCVD), sputtering, spin-on deposition, etc.

Figure 4:
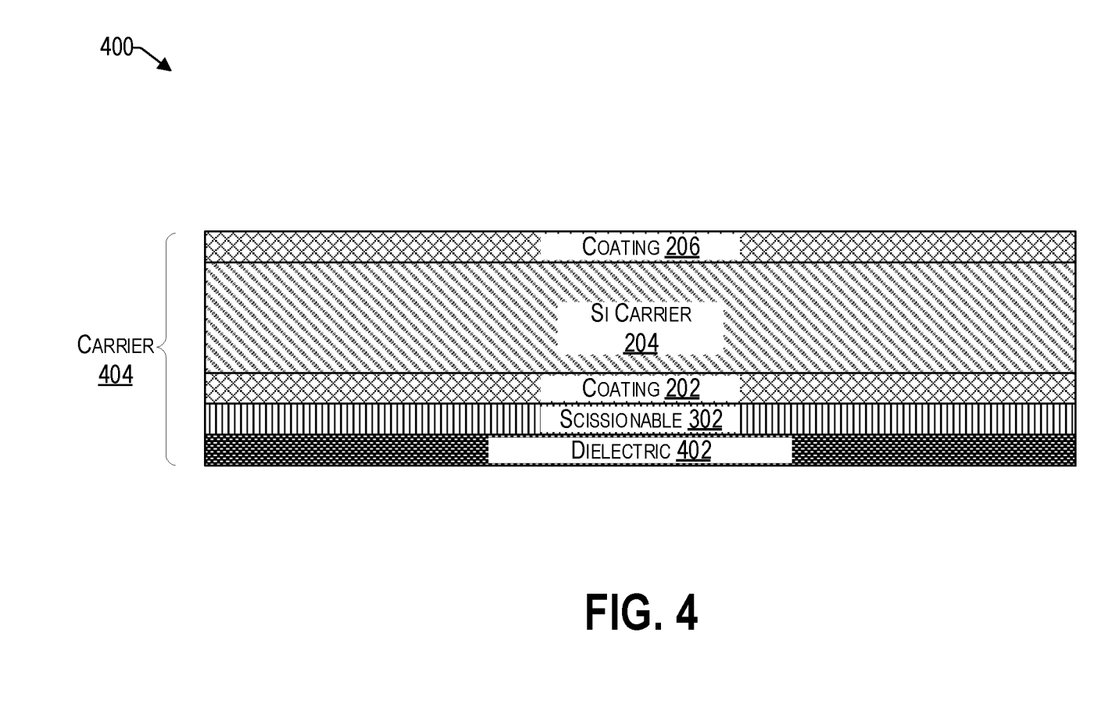
FIG. 4 illustrates a carrier structure that includes a hard-dielectric layer, deposited on the bottom surface of the scissionable layer.

FIG. 4 illustrates a carrier structure 400 that includes a hard-dielectric layer 402, deposited on the bottom surface of the scissionable layer 302. For example, the hard-dielectric 402 can be deposited via Plasma-enhanced chemical vapor deposition (PECVD) process (e.g., at 300 C or higher). In various embodiments, the hard-dielectric layer 402 can comprise, without limitation, Silicon Nitrides, Silicon Oxynitrides, Silicon Oxycarbonitrides, Silcon Carbonitrides Boron Nitrides, Boron Oxynitrides, Boron Oxycarbonitrides, Boron Carbonitrides, Aluminum Nitrides, Aluminum Oxynitrides, Aluminum Oxycarbonitrides, and/or Aluminum Carbonitrides. Generally speaking, any Oxide, Oxynitride, Oxycarbonitrides, Carbonitrides layer w/thermal conductivity equal or higher than silicon-based oxides that can be used for wafer bonding (e.g., Silicon dioxide). For applications that may tolerate temperatures higher than the ~400 C process limit for BEOL wiring, such as front-end-of-line (FEOL) oriented applications, diamond films are also supported by the teachings herein as a hard-dielectric layer.

Figure 5:
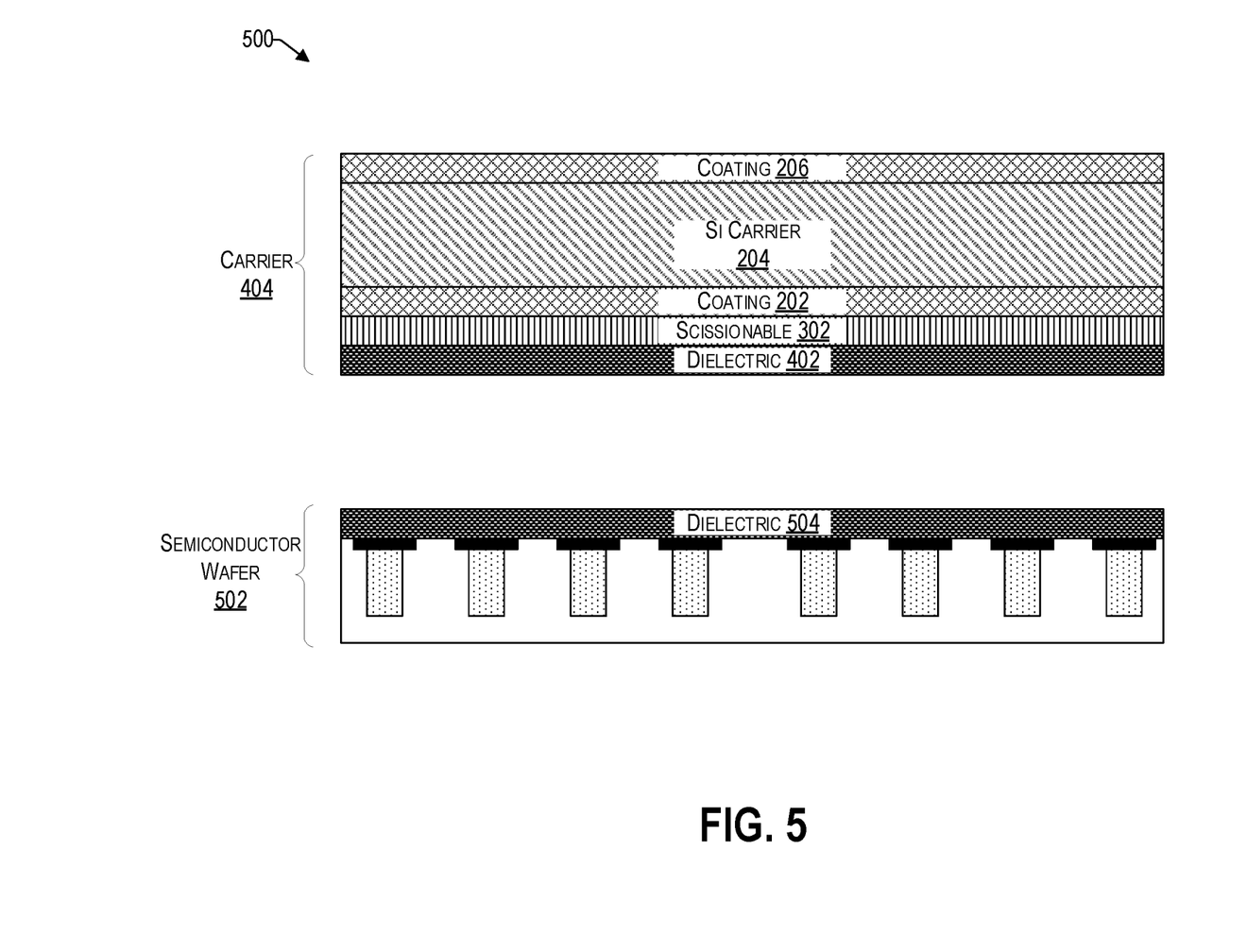
FIG. 5 illustrates an arrangement of the carrier structure of FIG. 4 placed above a semiconductor wafer, consistent with an illustrative embodiment.

FIG. 5 illustrates an arrangement 500 of the carrier structure 400 of FIG. 4 placed above a semiconductor wafer 502, consistent with an illustrative embodiment. In various embodiments, the semiconductor wafer 502 may include various circuits and structures consistent with integrated circuits. The semiconductor wafer 502 includes a hard-dielectric layer 504 on its top side, facing the dielectric layer 402 of the carrier 404. The hard-dielectric layer 504 may comprise a material that is substantially similar to that of the hard-dielectric layer 402 of the carrier 404. For example, the hard-dielectric layer 504 may be an oxide or other insulator bonding film stack (single or multilayer) via a plasma-enhanced chemical vapor deposition (PECVD) process at 300 C or above, directly on the semiconductor wafer 502. In one embodiment, the semiconductor wafer 502 has a scissionable layer underneath the dielectric layer 504 in addition to or instead of the scissionable layer 302 of the carrier 404.

Figure 6:
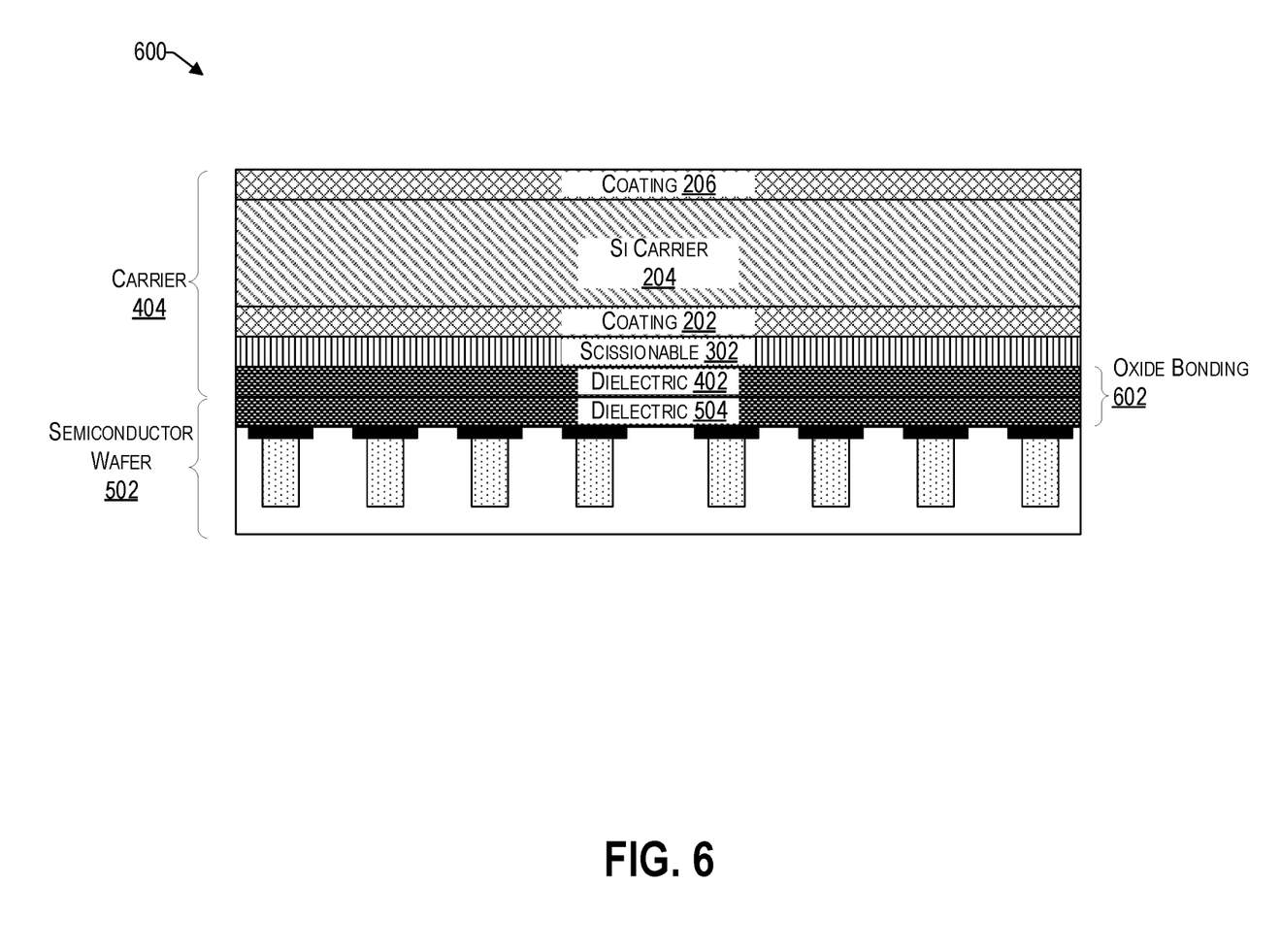
FIG. 6 illustrates a semiconductor structure of a carrier that is bonded to a semiconductor wafer, consistent with an illustrative embodiment.

FIG. 6 illustrates a semiconductor structure 600 of a carrier 404 that is bonded to the semiconductor wafer 502, consistent with an illustrative embodiment. Upon aligning the carrier 404 with the semiconductor wafer 502, the hard-dielectric 402 of the carrier is permanently bonded to the hard-dielectric layer 504 of the semiconductor wafer (e.g., oxide to oxide permanent bond). For example, Oxide (TEOS or other) may have dangling bonds, which are used to join the two interfaces effectively. In one embodiment, post bonding, there is a thermal anneal cycle at approximately 300 C to 400 C to create a stronger bond between the two different hard dielectric layers 402 and 504.

Figure 7:
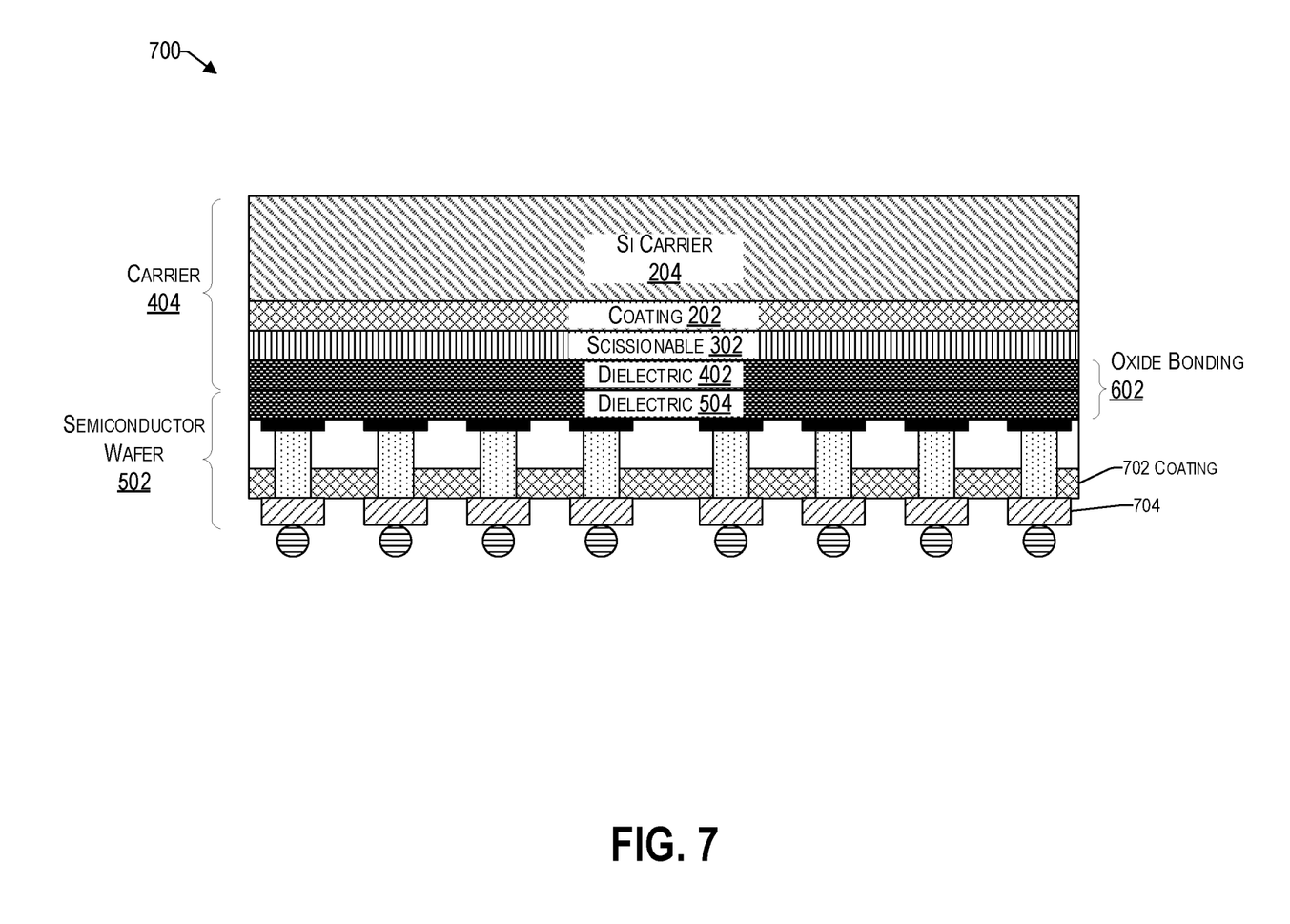
FIG. 7 illustrates a semiconductor structure that has undergone a wafer thinning process, consistent with an illustrative embodiment.

By virtue of coupling the carrier 404 to the semiconductor wafer, various desired semiconductor processing steps can be performed, which would not have been able to without the additional structural support offered by the carrier 404, in view of the fragility of the semiconductor wafer 504 independently. For example, the width of the semiconductor wafer 502 can be substantially reduced by way of a backside thinning (e.g., from 780 um to 100 um). In this regard, FIG. 7 illustrates a semiconductor structure 700 that has undergone a wafer thinning process, consistent with an illustrative embodiment. Various appropriate techniques such as grinding can be used to thin the semiconductor wafer. In this way, the through silicon vias (TSV) can be captured and coupled to pads, a redistribution layer (RDL) provided, flip chip (C4) compatible structure provided (e.g., Cu pedestal/pillar and solder cap 704), etc. There is a coating layer 702, which may be a silicon nitride, which is used to protect and seal the semiconductor wafer 502 and the TSV's mechanical integrity during a TSV reveal and capture process. In other embodiments, coating layer 702 can also be any other dielectric material that has a predetermined level of electrical barrier properties and mechanical strength (e.g., silicon oxynitrides, silicon carbonitrides, and other similar materials not based on silicon).

Figure 8:
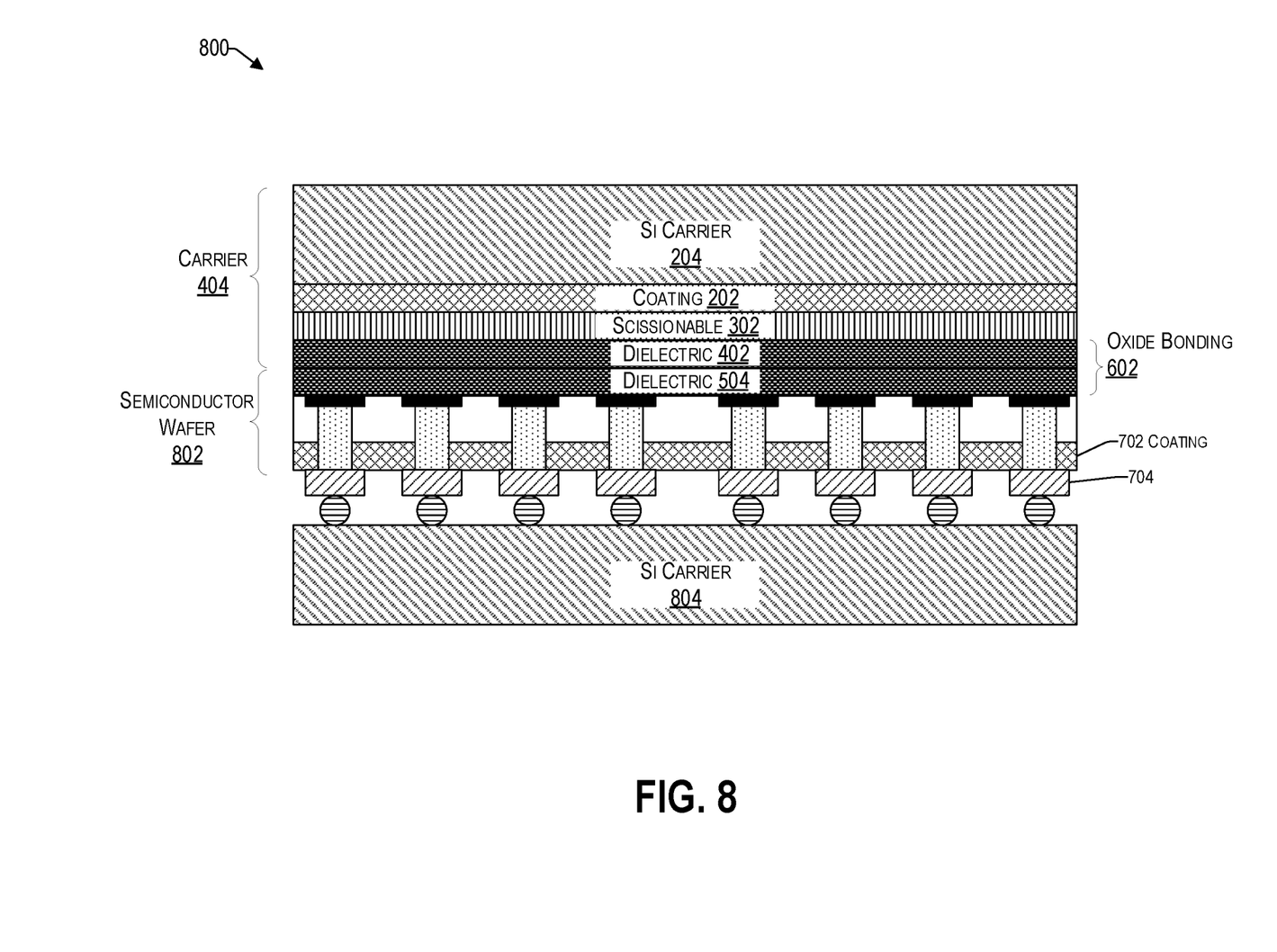
FIG. 8 illustrates a semiconductor structure that includes a second carrier coupled to the semiconductor structure of FIG. 7, consistent with an illustrative embodiment.

In some scenarios, the semiconductor structure 700 can be further enhanced by further processing to add and/or add additional functionality to the circuits of the semiconductor wafer 802. In this regard, FIG. 8 illustrates a semiconductor structure that includes a second carrier 804 coupled to the semiconductor structure of FIG. 7, consistent with an illustrative embodiment. In various embodiments, the second carrier can be aligned and held together by tape or any appropriate adhesive (e.g., to maximize flexibility in processing depending on the application, especially in cases where high topography may require the use of an adhesive layer), which may be removable by subsequent laser and/or chemical processes. In this way, the first carrier 404 can later be removed, while maintaining the structural integrity of the semiconductor wafer 802 for further processing. Further processing can include, for example, additional wafers coupled and in electrical communication with the semiconductor wafer 802.

Figure 9:
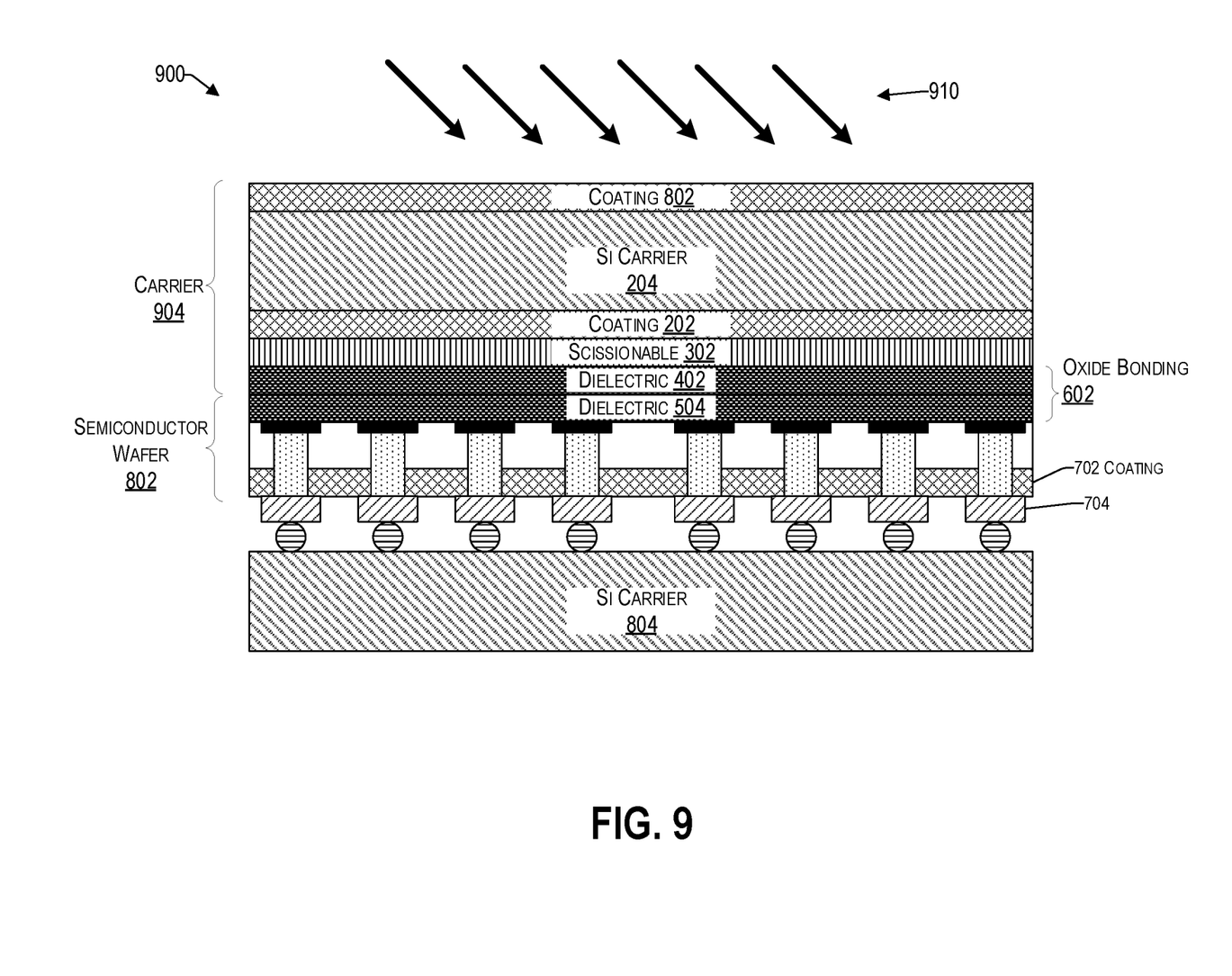
FIG. 9 illustrates the semiconductor structure of FIG. 8 being exposed to infrared radiation, consistent with an illustrative embodiment.

FIG. 9 illustrates a scenario 900 of the semiconductor structure 800 of FIG. 8 being exposed to infrared (IR) radiation 910, consistent with an illustrative embodiment. For example, IR (i.e., mid IR) laser radiation 910 is applied through the first carrier 904 to the scissionable layer 302 to release the first carrier 904 from the remaining structure of the semiconductor wafer 802, the appropriate connectors 704 and the and second carrier 804. The IR radiation 910 is operative to break the bonds in the scissionable layer 302 and de-bond the top of the semiconductor wafer 802 from the first carrier 904.

Figure 10:
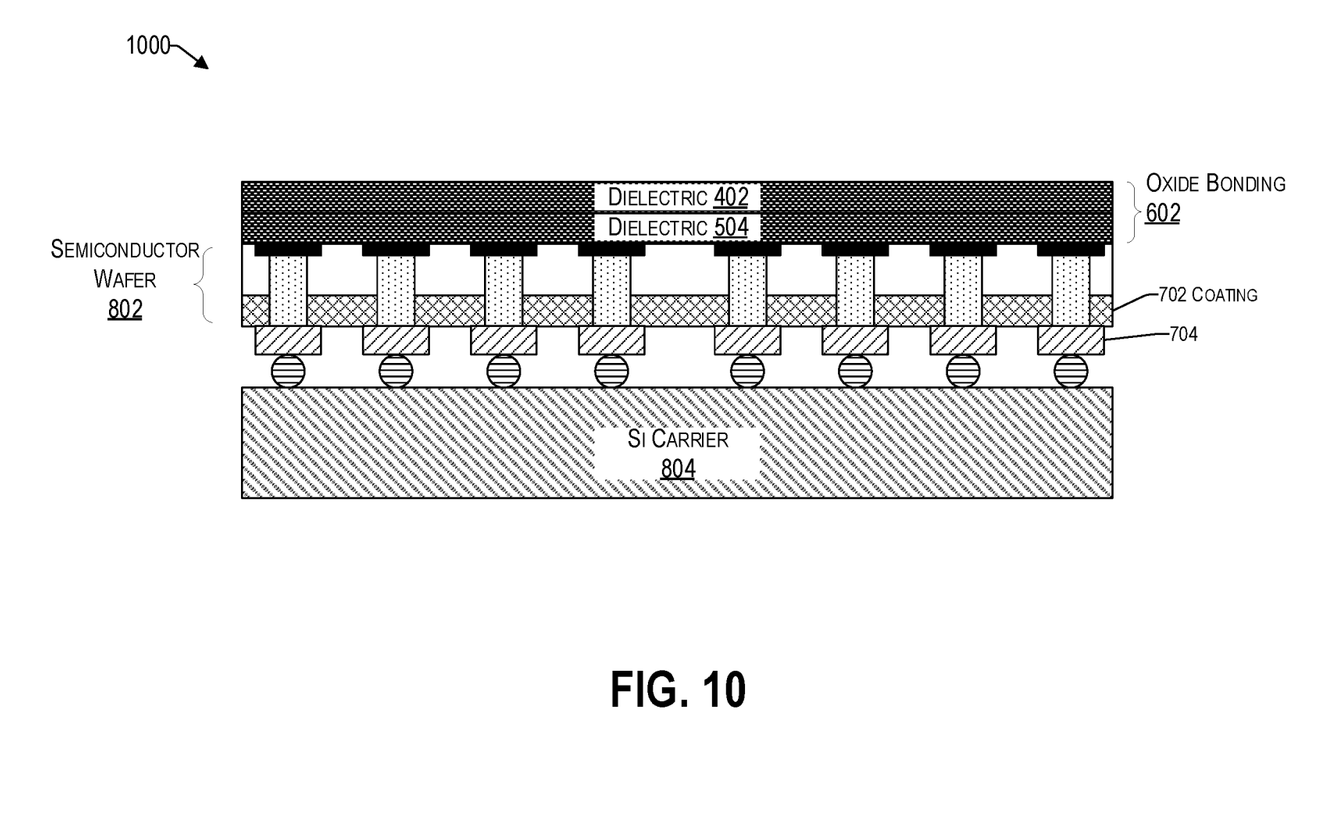
FIG. 10, illustrates a semiconductor structure that has maintained a hard-dielectric to be used for BEOL connections, consistent with an illustrative embodiment.

FIG. 10 illustrates the semiconductor structure 900 of FIG. 9 with its top carrier 404 removed, consistent with an illustrative embodiment. Any remaining scissionable layer 302 can be removed, for example, by a chemical etching process. Notably, the bonded structure of 602 comprising the top dielectric 402 and the bottom dielectric 504 that have been bonded together in a prior processing step, is not removed. Rather, the bonded structure 602 is used to provide support for a regular back end of line (BEOL) processing to provide electrical connectivity to the circuits of the semiconductor wafer 802. For example, in various embodiments, individual semiconductor devices, such as transistors, resistors, inductors, capacitors, resistors, etc., can get interconnected with wiring of the semiconductor wafer 802 through the BEOL wiring through the first and second hard dielectrics 402, 504. Accordingly, electrical connectivity can be provided down to the semiconductor wafer 802. In the semiconductor structure 1000 of FIG. 10, the hard-dielectric 602 is used for BEOL connections 1002, as illustrated in FIG. 1 previously. In this way, the top surface of the chip is able to communicate outside of the semiconductor wafer 802, as well as accept additional circuits thereon (e.g., another semiconductor wafer having electrical connectivity path to the top of the dielectric 402). The process may be repeated to create a stacked architecture having multiple levels that are all interconnected.

By virtue of using the process discussed herein, various processing constraints that are inherent when adhesives are used are lifted. For example, the processing on the backside of a 3D wafer after the bonding to the first carrier wafer is facilitated. The second bonding of a carrier wafer for some applications may be by use of adhesive. For example, the processing can be performed using a typical BEOL semiconductor infrastructure that is operated at a high temperature (e.g., 400 C). Indeed, if aluminum is used as the scissionable layer, processing of the structure at up to 500 C is supported.

It is noted that known processes that use an adhesive layer (instead of the dielectric to dielectric bonding described herein), typically cannot exceed 300 C. Stated differently, the process discussed herein is no longer bound by the thermal stability constraints of the adhesive, which is typically 300 C or lower. Thus, if a regular adhesive were used in the context of the processing performed with respect to structures of FIGS. 7 to 9, the process would be limited by the stability of the adhesive, including the thermal integrity of the adhesive and the contaminants introduced during the removal thereof. For example, a concern regarding adhesive contamination may be due to a potential overflow from the wafer edge during bonding, which can lead to a sticky wafer edge and misprocess events when the wafer is handled by semiconductor equipment. To avoid such contamination, extra specialized cleaning equipment would typically be involved that would increase costs and reduce overall throughput. Accordingly, since adhesives have not been used in the processing discussed herein, it is not subject to the contamination concerns inherent in the use of adhesives.

While the manufacture of a single semiconductor wafer is being shown for simplicity, it will be understood that any desired number of semiconductor wafers can be stacked based on the teachings herein. Further, while the term wafer is used for discussion purposes, it will be understood that diced chips can be used as well.

The method as described above may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip may be mounted in a single chip package (such as a plastic carrier, with leads that are affixed to a motherboard or other higher-level carrier) or in a multichip package (such as a ceramic carrier that has either or both surface interconnections or buried interconnections). In any case, the chip can then be integrated with other chips, discrete circuit elements, and/or other signal processing devices as part of either (a) an intermediate product, such as a motherboard, or (b) an end product. The end product can be any product that includes integrated circuit chips, ranging from low-end applications, such as toys, to advanced computer products having a display, a keyboard or other input device, and a central processor.

CONCLUSION

The descriptions of the various embodiments of the present teachings have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

While the foregoing has described what are considered to be the best state and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications and variations that fall within the true scope of the present teachings.

The components, steps, features, objects, benefits and advantages that have been discussed herein are merely illustrative. None of them, nor the discussions relating to them, are intended to limit the scope of protection. While various advantages have been discussed herein, it will be understood that not all embodiments necessarily include all advantages. Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

Numerous other embodiments are also contemplated. These include embodiments that have fewer, additional, and/or different components, steps, features, objects, benefits, and advantages. These also include embodiments in which the components and/or steps are arranged and/or ordered differently.

While the foregoing has been described in conjunction with exemplary embodiments, it is understood that the term "exemplary" is merely meant as an example, rather than the best or optimal. Except as stated immediately above, nothing that has been stated or illustrated is intended or should be interpreted to cause a dedication of any component, step, feature, object, benefit, advantage, or equivalent to the public, regardless of whether it is or is not recited in the claims.

It will be understood that the terms and expressions used herein have the ordinary meaning as is accorded to such terms and expressions with respect to their corresponding respective areas of inquiry and study except where specific meanings have otherwise been set forth herein. Relational terms such as first and second and the like may be used solely to distinguish one entity or action from another without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "a" or "an" does not, without further constraints, preclude the existence of additional identical elements in the process, method, article, or apparatus that comprises the element.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments have more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separately claimed subject matter.

What is claimed is:

1. A semiconductor structure, comprising:
   a carrier wafer;
   a semiconductor wafer coupled on top of the carrier wafer;
   a first dielectric layer on top of the semiconductor wafer;
   a second dielectric layer directly bonded on top of the first dielectric layer; and
   one or more back end of line (BEOL) wiring passing from a top surface of the semiconductor wafer through the first and second dielectric layers,
   wherein the first and second dielectric layers comprise a diamond film.

2. The semiconductor structure of claim 1, wherein the first and second dielectric layers comprise oxide.

3. The semiconductor structure of claim 1, wherein the first and second dielectric layers have a thermal conductivity equal to or higher than that of Silicon oxide.

4. The semiconductor structure of claim 1, wherein a thickness of the semiconductor wafer is thinned to 50 μm to 100 μm.

5. The semiconductor structure of claim 1, wherein the carrier wafer comprises glass.

6. The semiconductor structure of claim 1, wherein the bond between the first dielectric layer and the second dielectric layer is an oxynitride bond.

7. The semiconductor structure of claim 1, wherein the bond between the first dielectric layer and the second dielectric layer is a nitride bond.

8. A method of fabricating a semiconductor structure, comprising:
   providing a first carrier wafer;
   coating at least one of a top surface or a bottom surface of the carrier wafer with an anti-reflective layer;
   forming a scissionable layer that is able to absorb infrared (IR) radiation, below the first carrier wafer;
   forming a first hard-dielectric layer below the scissionable layer;
   forming a second hard-dielectric layer on a top surface of a semiconductor wafer;
   directly bonding the first dielectric layer with the second dielectric layer;
   forming connectors on a bottom portion of the semiconductor wafer to provide an electric connection to the semiconductor wafer;
   connecting a second carrier wafer to the connectors on the bottom portion of the semiconductor wafer;
   separating the first carrier wafer from the semiconductor wafer by degrading the scissionable layer with an infrared (IR) radiation, by passing the IR through the first carrier wafer; and
   providing a back end of line (BEOL) wiring passing from a top surface of the semiconductor wafer through the first and second dielectric layers.

9. The method of claim 8, wherein the scissionable layer comprises aluminum (Al).

10. The method of claim 8, wherein the scissionable layer is a Light-To-Heat-Conversion Release Coating (LTHC) layer.

11. The method of claim 8, wherein the first and second dielectric layers comprise oxide.

12. The method of claim 8, further comprising, after the direct bonding of the first dielectric layer with the second dielectric layer, performing a thermal anneal to create a stronger bond between the first dielectric layer and the second dielectric layer.

13. The method of claim 8, further comprising, after the direct bonding of the first dielectric layer with the second dielectric layer, thinning the semiconductor wafer.

14. The method of claim 13, wherein the thinning of the semiconductor wafer is to a thickness of 50 um to 100 um.

15. The method of claim 8, wherein the anti-reflective layer comprises nitride.

16. The method of claim 8, wherein the second carrier wafer is connected below the semiconductor wafer with an adhesive.

17. The method of claim 8, wherein the semiconductor wafer includes a scissionable layer below the second hard-dielectric layer.

18. A method of fabricating a semiconductor structure, comprising:
   providing a first carrier wafer;
   forming a scissionable layer that is able to absorb infrared (IR) radiation, below the first carrier wafer;
   forming a first hard-dielectric layer below the scissionable layer;
   forming a second hard-dielectric layer on a top surface of a semiconductor wafer;
   directly bonding the first dielectric layer with the second dielectric layer;
   forming connectors on a bottom portion of the semiconductor wafer to provide an electric connection to the semiconductor wafer;
   connecting a second carrier wafer to the connectors on the bottom portion of the semiconductor wafer;
   separating the first carrier wafer from the semiconductor wafer by degrading the scissionable layer with an infrared (IR) radiation, by passing the IR through the first carrier wafer;
   upon separating the first carrier wafer from the semiconductor wafer, removing a residual of the scissionable layer by way of a chemical etching of the scissionable layer; and
   providing a back end of line (BEOL) wiring passing from a top surface of the semiconductor wafer through the first and second dielectric layers.

\* \* \* \* \*